United States Patent
Sah et al.

(10) Patent No.: US 10,068,323 B2
(45) Date of Patent: Sep. 4, 2018

(54) AWARE SYSTEM, METHOD AND COMPUTER PROGRAM PRODUCT FOR DETECTING OVERLAY-RELATED DEFECTS IN MULTI-PATTERNED FABRICATED DEVICES

(71) Applicant: KLA-Tencor Corporation, Milpitas, CA (US)

(72) Inventors: Kaushik Sah, Kessel Lo (BE); Andrew James Cross, Altrincham (GB)

(73) Assignee: KLA-TENCOR CORPORATION, Milpitas, CA (US)

( * ) Notice: Subject to any disclaimer, the term of this patent is extended or adjusted under 35 U.S.C. 154(b) by 28 days.

(21) Appl. No.: 15/290,990

(22) Filed: Oct. 11, 2016

(65) Prior Publication Data

US 2017/0294012 A1 Oct. 12, 2017

Related U.S. Application Data

(60) Provisional application No. 62/320,612, filed on Apr. 10, 2016.

(51) Int. Cl.
G06T 7/00 (2017.01)
H01L 21/66 (2006.01)
H01L 21/033 (2006.01)

(52) U.S. Cl.
CPC ............ *G06T 7/0004* (2013.01); *H01L 22/20* (2013.01); *G06T 2207/30148* (2013.01); *H01L 21/0332* (2013.01); *H01L 21/0338* (2013.01); *H01L 22/12* (2013.01)

(58) Field of Classification Search
CPC ......... G06T 7/0004; G06T 2207/30148; H01L 22/12; H01L 21/0338; H01L 21/0332
See application file for complete search history.

(56) References Cited

U.S. PATENT DOCUMENTS

| 4,942,619 A | 7/1990 | Takagi et al. |
| 8,126,255 B2 | 2/2012 | Bhaskar et al. |
| 9,087,176 B1 * | 7/2015 | Chang .................. G06F 17/5081 |
| 2012/0198404 A1 | 8/2012 | Hasebe |
| 2014/0037187 A1 | 2/2014 | Marcuccilli et al. |

(Continued)

FOREIGN PATENT DOCUMENTS

| WO | 2011085255 A2 | 7/2011 |
| WO | 2014022682 A1 | 2/2014 |
| WO | 2015006230 A1 | 1/2015 |

OTHER PUBLICATIONS

International Search Report from PCT Application No. PCT/US2017/026207, dated Nov. 27, 2017.

*Primary Examiner* — Brenda C Bernardi
(74) *Attorney, Agent, or Firm* — Zilka-Kotab, PC

(57) ABSTRACT

A design aware system, method, and computer program product are provided for detecting overlay-related defects in multi-patterned fabricated devices. In use, a design of a multi-patterned fabricated device is received by a computer system. Then, the computer system automatically determines from the design one or more areas of the design that are prone to causing overlay errors. Further, an indication of the determined one or more areas is output by the computer system to an inspection system for use in inspecting a multi-patterned device fabricated in accordance with the design.

19 Claims, 7 Drawing Sheets

(56) References Cited

U.S. PATENT DOCUMENTS

2015/0012900 A1\* 1/2015 Shifrin ............... G01N 21/9501
                                                      716/112
2017/0109646 A1\* 4/2017 David ..................... G03F 7/705
2017/0256465 A1\* 9/2017 Van Leest ........... G06F 17/5072

\* cited by examiner

US 10,068,323 B2

AWARE SYSTEM, METHOD AND COMPUTER PROGRAM PRODUCT FOR DETECTING OVERLAY-RELATED DEFECTS IN MULTI-PATTERNED FABRICATED DEVICES

RELATED APPLICATION(S)

This application claims the benefit of U.S. Provisional Patent Application No. 62/320,612 filed Apr. 10, 2016, the entire contents of which are incorporated herein by reference.

FIELD OF THE INVENTION

The present invention relates to inspection of fabricated devices, and more particularly to detecting defects in fabricated devices.

BACKGROUND

Currently, defects in fabricated devices (e.g. wafers) can be detected by comparing a target component of a fabricated device to reference components of the fabricated device. Inspection systems accomplish this by taking images of the target and reference components for comparison purposes. In particular, detecting the defects often involves performing two separate comparisons to generate two separate results, one comparison being between the target component and one of the reference components and another comparison being between the target component and the other one of the reference components. Any similarity between the two separate comparison results is generally used as an indicator of a defect in the target component. This is known as a two-pass approach or double detection.

Prior art FIG. 1 shows a traditional layout for a wafer having a plurality of target components in a column 102, each being a same pattern modulated (i.e. amplified) by a different (e.g. incremental) combination of parameter (e.g. focus (F) and exposure (E)) values, and further having a plurality of reference components in columns 104, 106 situated on either side of the column of target components and each being a nominal (i.e. not modulated) version of the same pattern. Thus, for any particular one of the target components in column 102, a corresponding reference component from column 104 and a corresponding reference component from column 106 may be used for detecting defects in the particular target component (see box 108). While the reference components are shown as being adjacent to the target component, this is not necessarily always the case. For example, in other wafer configurations the reference components for any particular target component may be those closest, but not necessarily adjacent, to the particular target component.

Recently, multi-patterning lithography has been introduced to enhance feature density of fabricated devices, which allows for smaller sized components having equivalent or even increased patterning to traditional components. FIG. 2 shows an example of a multi-patterned component of a fabricated device, and particularly a structure printed with triple patterning. As shown, a single layer is patterned with three masks (A, B, and C) having separation (Regions 1 and 2) therebetween. However, use of multi-patterning lithography has introduced a new potential type of defect, namely overlay defects resulting from positioning errors between the different masks. While some defect detection processes have been modified to account for overlay (e.g. U.S. Patent Publication No. 2014/0037187, filed Mar. 2, 2013 to Marcuccilli et al.), these existing defect detection processes still exhibit various limitations.

In particular, as noted above, existing defect detection processes have simply been modified to account for overlay. Thus, the methods used by these defect detection processes, such as that described with respect to FIG. 1, have not been improved but have merely been applied to a new parameter (overlay). Unfortunately, however, these methods exhibit various limitations. One exemplary limitation of existing defect detection processes is that they are not design-aware. In other words, these processes do not take into account the design of the components when performing the defect detection, but instead simply identify defects or errors in the design as a result of defects detected on the fabricated device.

There is thus a need for addressing these and/or other issues associated with the prior art techniques used for defect detection in fabricated devices.

SUMMARY

A design aware system, method, and computer program product are provided for detecting overlay-related defects in multi-patterned fabricated devices. In use, a design of a multi-patterned fabricated device is received by a computer system. Then, the computer system automatically determines from the design one or more areas of the design that are prone to causing overlay errors. Further, an indication of the determined one or more areas is output by the computer system to an inspection system for use in inspecting a multi-patterned device fabricated in accordance with the design.

DETAILED DESCRIPTION

The following description discloses a system, method, and computer program product for detecting overlay-related defects in multi-patterned fabricated devices. It should be noted that this system, method, and computer program product, including the various embodiments described below, may be implemented in the context of any inspection or review system (e.g. wafer inspection, reticle inspection, laser scanning inspection systems, Defect scanning electron microscope (SEM) review, etc.), such as the one described below with reference to FIG. 3B.

Figure 3A:
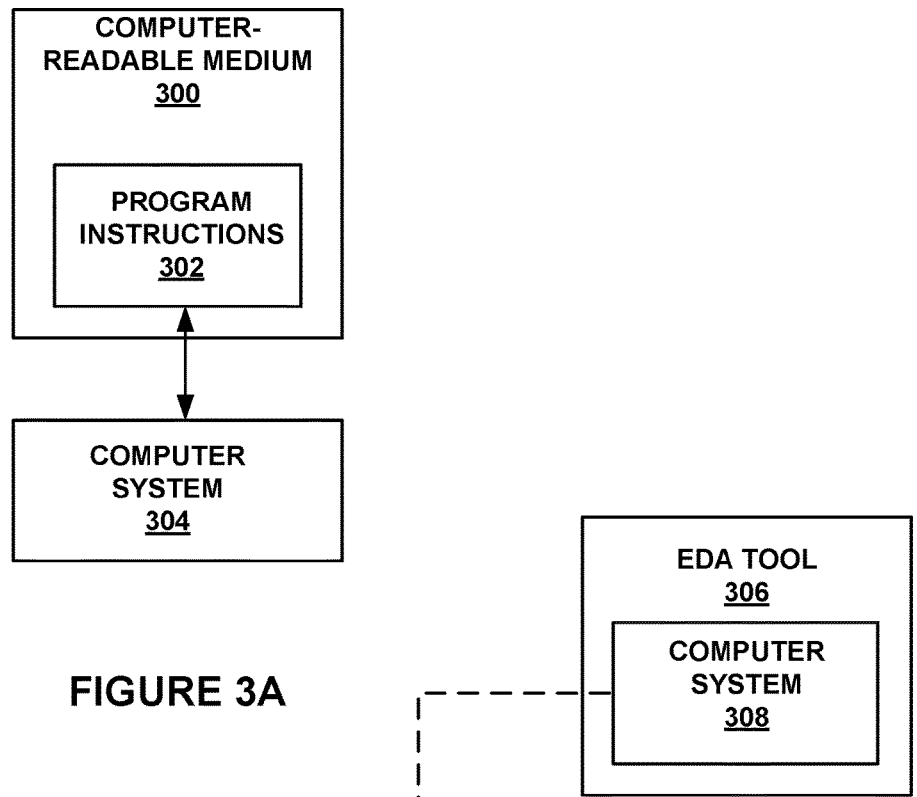
FIG. 3A shows a block diagram illustrating one embodiment of a non-transitory computer-readable medium that includes program instructions executable on a computer system for performing one or more of the computer-implemented methods described herein.

An additional embodiment relates to a non-transitory computer-readable medium storing program instructions executable on a computer system for performing a computer-implemented design aware method for detecting overlay-related defects in multi-patterned fabricated devices. One such embodiment is shown in FIG. 3A. In particular, as shown in FIG. 3A, computer-readable medium 300 includes program instructions 302 executable on computer system 304. The computer-implemented method includes the steps of the method described below with reference to FIG. 4. The computer-implemented method for which the program instructions are executable may include any other operations described herein (e.g. with respect to the methods of FIGS. 5 and/or 7).

Program instructions 302 implementing methods such as those described herein may be stored on computer-readable medium 300. The computer-readable medium may be a storage medium such as a magnetic or optical disk, or a magnetic tape or any other suitable non-transitory computer-readable medium known in the art. As an option, computer-readable medium 300 may be located within computer system 304.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), or other technologies or methodologies, as desired.

The computer system 304 may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer system 304 may also include any suitable processor known in the art such as a parallel processor. In addition, the computer system 304 may include a computer platform with high speed processing and software, either as a standalone or a networked tool.

Figure 3B:
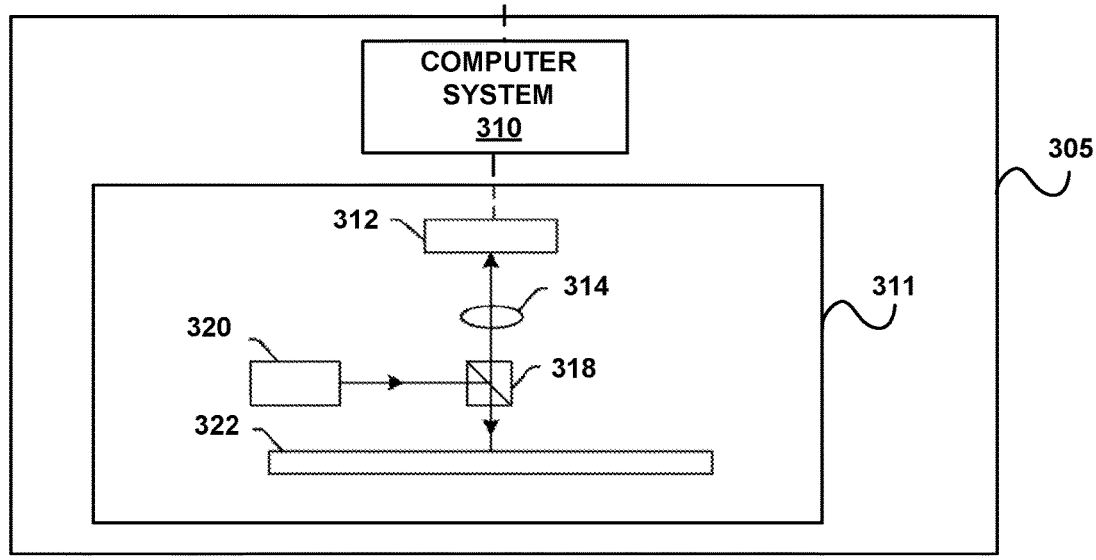
FIG. 3B is a schematic diagram illustrating a side view of one embodiment of an inspection system configured to detect defects on a fabricated device.

An additional embodiment relates to a design aware system configured to for detect overlay-related defects in multi-patterned fabricated devices. One embodiment of such a system is shown in FIG. 3B. The system includes inspection system 305 configured to generate output for a component being fabricated on a wafer (or other device), which may be configured in this embodiment as described with reference to FIG. 6. The system also includes one or more computer systems configured for performing the operations described below with reference to FIG. 4. The one or more computer systems may be configured to perform these operations according to any of the embodiments described herein. The computer system(s) and the system may be configured to perform any other operations described herein and may be further configured as described herein.

In the embodiment shown in FIG. 3B, one of the computer systems is part of an electronic automation design (EAD) tool, and the inspection system and another of the computer systems are not part of the EAD tool. These computer system may include, for example, the computer system 304 described above with reference to FIG. 3A. For example, as shown in FIG. 3B, one of the computer systems may be computer system 308 included in EAD tool 306. The EAD tool 306 and the computer system 308 included in such a tool may include any commercially available EAD tool.

The inspection system 305 may be configured to generate the output for the component fabricated on a wafer by scanning the wafer with light and detecting light from the wafer during the scanning. For example, as shown in FIG. 3B, the inspection system 305 includes light source 320, which may include any suitable light source known in the art. Light from the light source may be directed to beam splitter 318, which may be configured to direct the light from the light source to wafer 322. The light source 320 may be coupled to any other suitable elements (not shown) such as one or more condensing lenses, collimating lenses, relay lenses, objective lenses, apertures, spectral filters, polarizing components and the like. As shown in FIG. 3B, the light may be directed to the wafer 322 at a normal angle of incidence. However, the light may be directed to the wafer 322 at any suitable angle of incidence including near normal and oblique incidence. In addition, the light or multiple light beams may be directed to the wafer 322 at more than one angle of incidence sequentially or simultaneously. The inspection system 305 may be configured to scan the light over the wafer 322 in any suitable manner.

Light from wafer 322 may be collected and detected by one or more channels of the inspection system 305 during scanning. For example, light reflected from wafer 322 at angles relatively close to normal (i.e., specularly reflected light when the incidence is normal) may pass through beam splitter 318 to lens 314. Lens 314 may include a refractive optical element as shown in FIG. 3B. In addition, lens 314 may include one or more refractive optical elements and/or one or more reflective optical elements. Light collected by lens 314 may be focused to detector 312. Detector 312 may include any suitable detector known in the art such as a charge coupled device (CCD) or another type of imaging detector. Detector 312 is configured to generate output that is responsive to the reflected light collected by lens 314. Therefore, lens 314 and detector 312 form one channel of the inspection system 305. This channel of the inspection system 305 may include any other suitable optical components (not shown) known in the art.

Since the inspection system shown in FIG. 3B is configured to detect light specularly reflected from the wafer 322, the inspection system 305 is configured as a BF inspection system. Such an inspection system 305 may, however, also be configured for other types of wafer inspection. For example, the inspection system shown in FIG. 3B may also include one or more other channels (not shown). The other channel(s) may include any of the optical components described herein such as a lens and a detector, configured as a scattered light channel. The lens and the detector may be further configured as described herein. In this manner, the inspection system 305 may also be configured for DF inspection.

The inspection system 305 may also include a computer system 310 that is configured to perform one or more steps of the methods described herein. For example, the optical elements described above may form optical subsystem 311 of inspection subsystem 305, which may also include computer system 310 that is coupled to the optical subsystem 311. In this manner, output generated by the detector(s) during scanning may be provided to computer system 310.

For example, the computer system 310 may be coupled to detector 312 (e.g., by one or more transmission media shown by the dashed line in FIG. 3B, which may include any suitable transmission media known in the art) such that the computer system 310 may receive the output generated by the detector.

The computer system 310 of the inspection system 305 may be configured to perform any operations described herein. For example, computer system 310 may be configured for performing the defect detection as described herein. In addition, computer system 310 may be configured to perform any other steps described herein. Furthermore, although some of the operations described herein may be performed by different computer systems, all of the operations of the method may be performed by a single computer system such as that of the inspection system 305 or a standalone computer system. In addition, the one or more of the computer system(s) may be configured as a virtual inspector such as that described in U.S. Pat. No. 8,126,255 issued on Feb. 28, 2012 to Bhaskar et al., which is incorporated by reference as if fully set forth herein.

The computer system 310 of the inspection system 305 may also be coupled to another computer system that is not part of the inspection system such as computer system 308, which may be included in another tool such as the EAD tool 306 described above such that computer system 310 can receive output generated by computer system 308, which may include a design generated by that computer system 308. For example, the two computer systems may be effectively coupled by a shared computer-readable storage medium such as a fab database or may be coupled by a transmission medium (e.g. network, etc.) such as that described above such that information may be transmitted between the two computer systems.

It is noted that FIG. 3B is provided herein to generally illustrate a configuration of an inspection system that may be included in the system embodiments described herein. Obviously, the inspection system configuration described herein may be altered to optimize the performance of the inspection system as is normally performed when designing a commercial inspection system. In addition, the systems described herein may be implemented using an existing inspection system (e.g., by adding functionality described herein to an existing inspection system) such as the 39xx/29xx/28xx series of tools that are commercially available from KLA-Tencor. For some such systems, the methods described herein may be provided as optional functionality of the system (e.g., in addition to other functionality of the system). Alternatively, the system described herein may be designed "from scratch" to provide a completely new system.

Figure 4:
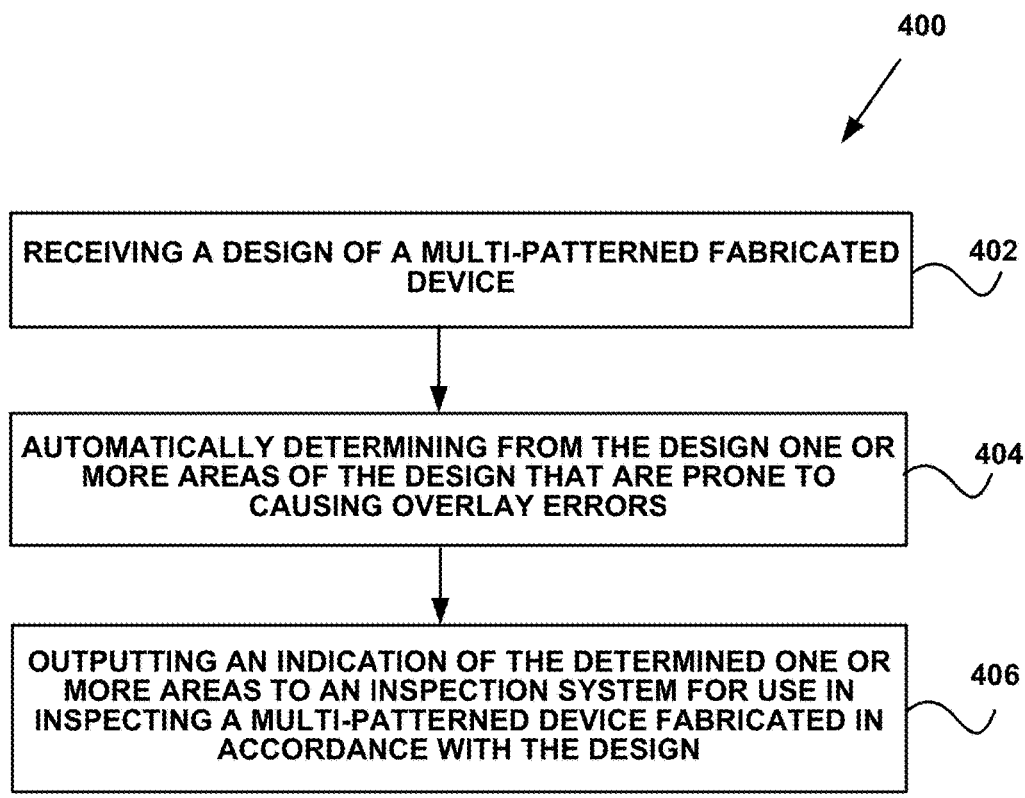
FIG. 4 illustrates a design aware method for detecting overlay-related defects in multi-patterned fabricated devices, in accordance with an embodiment.

FIG. 4 illustrates a design aware method 400 for detecting overlay-related defects in multi-patterned fabricated devices, in accordance with an embodiment. The method 400 may be carried out in the context of the environments described above with reference to FIGS. 3A and/or 3B. For example, the method 400 may be carried out by any of the computer systems described above in FIGS. 3A and/or 3B. Further, the aforementioned definitions may equally apply to the present description.

Figure 1:
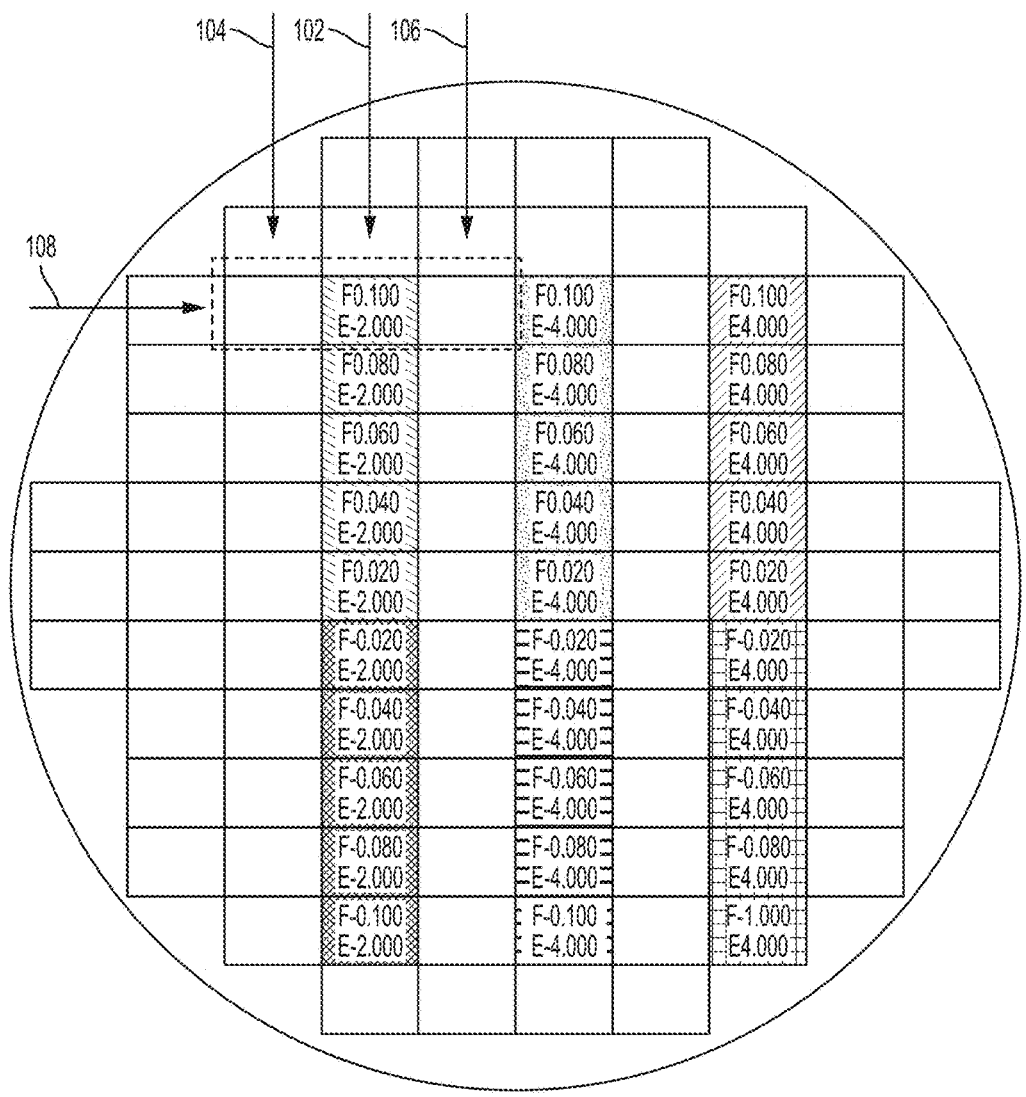
FIG. 1 shows an example layout for a wafer, in accordance with the prior art.
Figure 2:
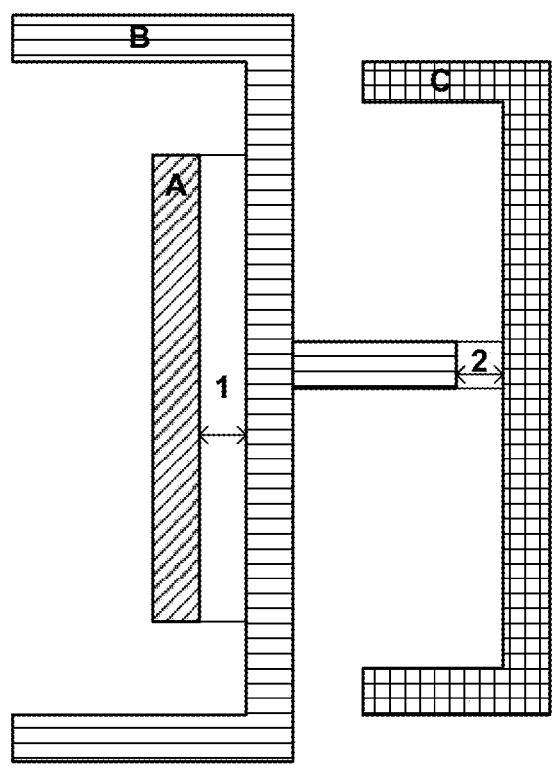
FIG. 2 shows an example of a multi-patterned structure, in accordance with the prior art.

As shown in operation 402, a design of a multi-patterned fabricated device is received. In the context of the present description, the multi-patterned fabricated device includes any fabricated device (e.g. wafer) having a single layer patterned (i.e. printed) with multiple masks, where there is at least some separation between the adjacent masks. One example of a multi-patterned fabricated device is shown in FIG. 2 described above. In an embodiment, the multi-patterned device is fabricated by separate patterning steps specific to the multiple masks. Where underlying patterns are also visible during inspection or review as described below, this capability can also then be utilized for determination of features prone to overlay variation between different patterning layers.

To this end, the design of the multi-patterned fabricated device is a model or other plan according to which the multi-patterned device can be fabricated. The design indicates intended features, components, measurements, etc. for the multi-patterned device, such as the multiple masks for the single layer of the device. As noted above, this design is received, which may be a result of the design being retrieved from memory or from being identified in any other desired manner.

Additionally, in operation 404, one or more areas of the design that are prone to causing overlay errors are automatically determined from the design. In other words, the design is evaluated in an automated manner to determine areas of the design that are prone to causing overlay errors. Each of these areas may also be referred to as a Care Area (CA). The evaluation may involve executing a script that takes the design as input and that outputs an indication of the areas of the design that are prone to causing overlay errors. It should be noted that in the context of the present description, the overlay errors refer to positioning errors between the different masks.

By way of example, the automatic determination of the one or more areas of the design that are prone to causing overlay errors may be based on one or more predefined rules. Namely, the predefined rules may be applied to the design to determine the areas of the design that are prone to causing overlay errors. These rules may each define a parameter value indicative of causing overlay errors, such as a threshold distance between two masks for a single layer of the multi-patterned fabricated device, a threshold pattern density for a mask of a single layer of the multi-patterned fabricated device, cell names for the multi-patterned fabricated device, etc. Further, the various rules may be applied in a preconfigured order, as an option, to progressively filter areas of the design where any ultimately resulting areas are those that are determined to be prone to causing overlay errors.

In one embodiment, the automatic determination may be made with respect to only two masks defined in the design for the single layer of the multi-patterned fabricated device. In this embodiment, input from a user that specifies the two masks may be received, and then the automatic determination of the one or more areas of the design that are prone to causing overlay errors may be performed with respect to the two specified masks by evaluating the two masks (e.g. in terms of the predefined rules) to determine the one or more areas of the design that are prone to causing overlay errors. As noted above, this evaluation may involve determining whether a threshold separation exists between the two masks, where any areas between the two masks with less than the threshold separation are determined to be prone to causing overlay errors. Of course, with respect to this embodiment, operation 404 may be repeated for different combinations of mask pairs.

In another embodiment, the automatic determination may be made with respect to evaluating all of the masks defined in the design for the single layer of the multi-patterned fabricated device. In this embodiment, all of the masks may be selected by default, and then the automatic determination of the one or more areas of the design that are prone to causing overlay errors may be performed with respect to all of the masks by evaluating the masks (e.g. in terms of the predefined rules) to determine the one or more areas of the design that are prone to causing overlay errors. Evaluating all of the masks may include determining whether a threshold separation exists between adjacent masks, where any areas between adjacent masks with less than the threshold separation are determined to be prone to causing overlay errors.

As another option, the method 400 may include ranking each of the one or more areas of the design that are determined to be prone to causing overlay errors. With respect to this option, a plurality of rankings may be available and may be indicative of differing levels of likelihood of causing overlay errors. For example, for an area of the design determined to be prone to causing overlay errors, a parameter value (e.g. threshold separation) of the area which caused the area to be determined as prone to causing an overlay error is determined, a plurality of incremental ranges are identified based on a preconfigured step size where each of the incremental ranges is associated with a different rank, one of the incremental ranges that includes the parameter value of the area is determined, and the area is assigned with the rank associated with the one of the incremental ranges determined for the area. Such a ranking can also be determined by simulation input, design related attributes, inspection attributes and review generated attributes. For the design related attributes ranking can also be determined by printability of structures, for example a concave structure will potentially be weaker (i.e. more prone to overlay errors) than a convex structure and therefore would be ranked higher. Further ranking of criticality can be done based on effect of overlay errors of these identified design areas on a subsequent design layer. For example, if there are two competing structures prone to fail due to overlay errors, the one which interacts more closely with an immediate subsequent design layer may be given higher importance.

Further, in operation 406, an indication of the determined one or more areas is output to an inspection system for use in inspecting a multi-patterned device fabricated in accordance with the design. This inspection may be employed to identify actual overlay errors on the multi-patterned device fabricated in accordance with the design, and as mentioned above, may focus specifically on the areas of the design that have been determined to be prone to overlay errors. Of course, in addition to the overlay parameter, the inspection may involve other well-known parameters as well, such as focus and exposure parameters. However, the method 400 described above may isolate areas susceptible to fail early due to overlay errors from those failing due to traditional focus or exposure variation.

For example, the inspection system may inspect the areas determined to be prone to causing overlay errors with an increased sensitivity. As another example, where a result of the above described ranking is also output to the inspection system, the inspection system may inspect the areas determined to be prone to causing overlay errors in order of the ranking and/or may inspect only a top number of ranked areas. It should be noted that the inspection system may be that described above with respect to FIG. 3B and/or any other inspection or review system capable of inspecting or otherwise reviewing a multi-patterned device fabricated in accordance with the design.

By determining the areas of the design that are prone to overlay errors in advance of any inspection, the time required to identify actual overlay errors may be improved.

For example, where typically a two-pass approach is required for an inspection as described above with respect to the prior art, the present method 400 may enable a one-pass approach by focusing specifically on areas that have already been determined to be prone to overlay defects. Further, in any case the processing required by the inspection system will be reduced by focusing on areas that have already been determined to be prone to overlay defects.

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 5:
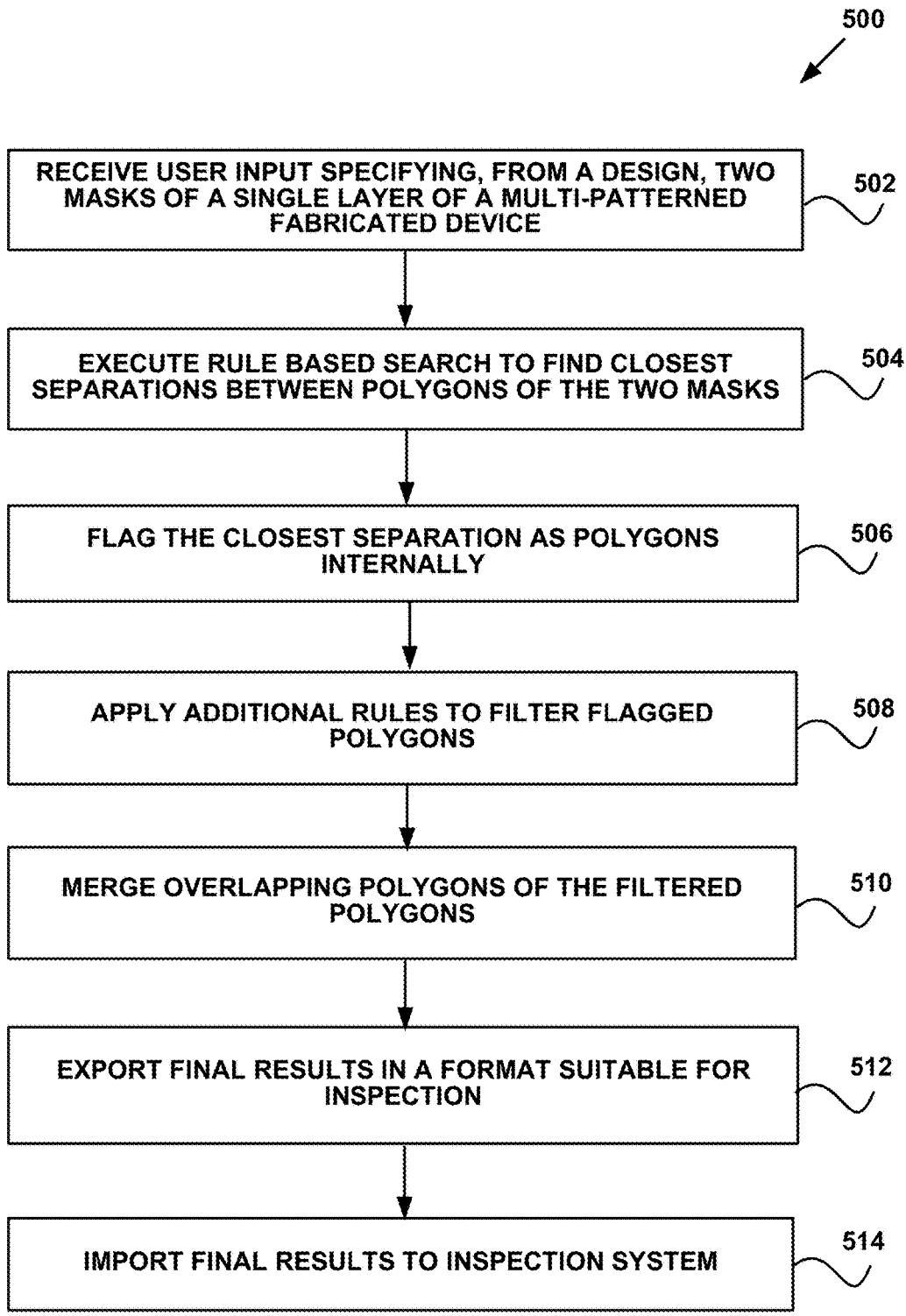
FIG. 5 illustrates a method of using a design to determine, between two masks of a single layer of a multi-patterned fabricated device, areas within the design that are prone to overlay errors, in accordance with another embodiment.

FIG. 5 illustrates a method 500 of using a design to determine, between two masks of a single layer of a multi-patterned fabricated device, areas within the design that are prone to overlay errors, in accordance with another embodiment. This method 500 may be carried out in the context of the method 400 of FIG. 4. For example, this method 500 may be a more specific example of the method 400 of FIG. 4. In one embodiment, the method 500 may be carried out using existing KLA-Tencor (Broadband Plasma) BBP inspection platforms using Nano-Point/Pin-Point technology.

As shown in operation 502, user input is received which specifies, from a design, two masks of a single layer of a multi-patterned fabricated device (i.e. mask 1 and mask 2). The user input may be received through a graphical user interface (GUI) which, for example, presents all masks of the single layer of the multi-patterned fabricated device and which allows for selection by the user of the two masks. For example, for a given process layer to be printed in multi-patterning, design layouts of each mask is required in separate layer IDs of a design file. Just by way of example, a metal layer may be composed of 3 mask layouts: A (layer ID 1), B (layer ID 2) and C (layer ID 3), in which case ID 1, ID 2, and ID3 may be specified in the design for the given process layer.

The user input may also specify (e.g. through the GUI or other GUIs) additional configuration parameters for use in determining areas of the design that are prone to causing overlay errors. Of course, these configuration parameters may alternatively be defined prior to the present method 500 (e.g. and commonly used by the method 500 when evaluating different designs, etc.) These configuration parameters may be those shown below in Table 1.

TABLE 1

1) Direction (−X, +X (horizontal), −Y, +Y (vertical) and combinations
2) Maximum Separation: floating number in angstrom, which denotes the how far apart the edges of polygons between two masks should be to be discarded from being flagged as a CA
3) Step size (optional): floating number in angstrom, which is an optional parameter if ranking of CA is required. Example if step size is 2 nm, then 0-2 nm proximity CAs are ranked 1, 2-4 nm are ranked 2, until max separation is reached. (Generally step size of 1 nm is seen to be suitable for 14/10 nm DR nodes). If not defined, then all CAs within max separation are flagged.
4) Minimum CA size: dimension of the minimum CA size in angstrom Then, in operation 504, a rule based search is executed to find closest separations between polygons of the two masks. In an embodiment, the rule based search may identify polygons between the two masks that have less than the Maximum Separation. In one example, the method 500 will look for separation (i.e. gaps) between edges/corners of polygons belonging to mask 1 to edges/corners of polygons in mask 2 in both the X and Y directions (separately and together). A finite element approach can be used which fragments the design into small blocks to calculate these gaps.

In operation 506, the closest separations are flagged internally. In other words, polygons between the two masks that have less than the Maximum Separation may be flagged in memory. Optionally, operation 506 may include internally storing the centroid of the above described fragments.

Next, as shown in operation 508, additional rules are applied to filter the flagged polygons. These additional rules may relate to other features of the design or inspection, and specifically other features of the selected masks, such as other geometric features that are further indicative of areas of a design that are prone to overlay errors.

Further, in operation 510, any of the resulting filtered polygons that overlap are merged. For example, two immediate qualifying centroids can be merged together if they overlap in any direction and belong to the same directional group (X, Y or XY). As option, after the merge the resulting polygons may be ranked to indicate a level of likelihood of being associated with a design area that is prone to overlay errors.

Figure 6:
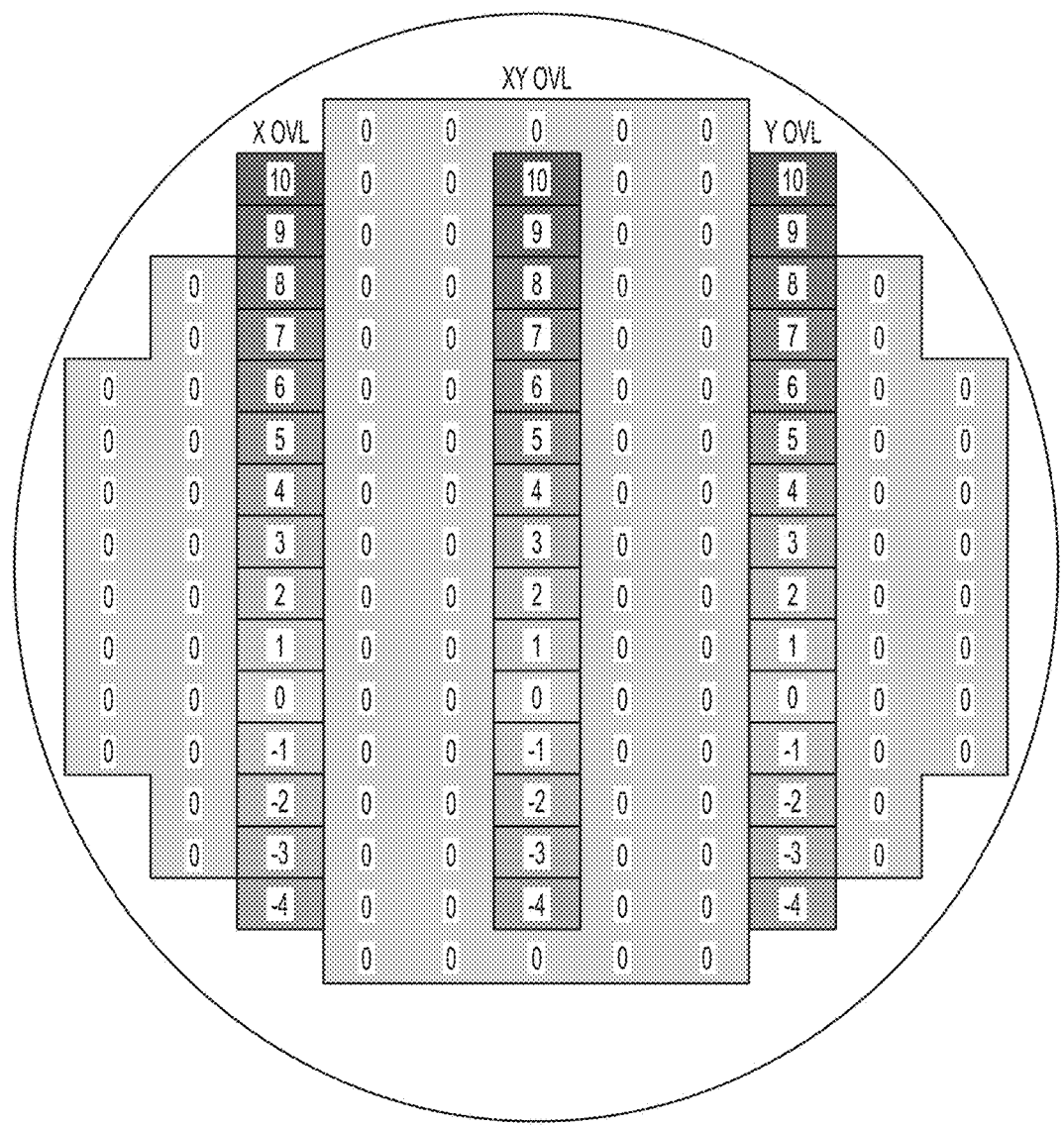
FIG. 6 illustrates a layout for a wafer having overlay modulation, in accordance with yet another embodiment.

The final result from operation 510 (or the ranked results) are exported in a format suitable for inspection, as shown in operation 512. This format may be a particular file format that is readable by an inspection system. The final results are then imported to the inspection system, as shown in operation 514, which may use the results in conjunction with an overlay modulation map to generate (e.g. large area) defect maps for various purposes (e.g. discovery, monitoring, etc.). FIG. 6 illustrates an example of an overlay modulation map (in nm) on a semiconductor wafer. In various exemplary embodiments, output of the inspection system may be provided as input to a metrology control plan or target design and/or used in relation to an overlay process window on the multi-patterned fabricated device.

Figure 7:
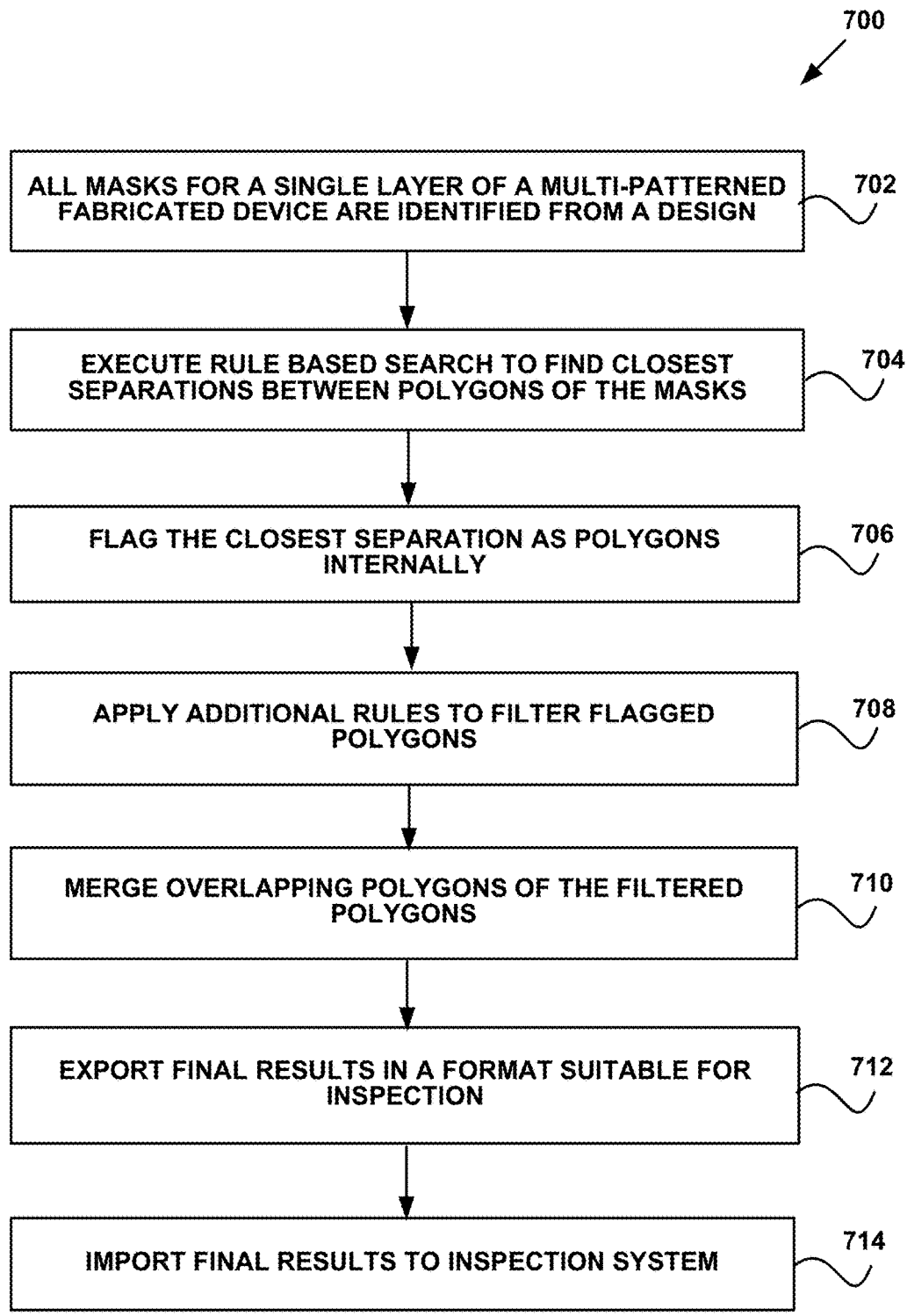
FIG. 7 illustrates a method of using a design to determine, between all masks of a single layer of a multi-patterned fabricated device, areas within the design that are prone to overlay errors, in accordance with still yet another embodiment.

FIG. 7 illustrates a method 700 of using a design to determine, between all masks of a single layer of a multi-patterned fabricated device, areas within the design that are prone to overlay errors, in accordance with still yet another embodiment. This method 700 may be carried out in the context of the method 400 of FIG. 4. For example, this method 700 may be a more specific example of the method 400 of FIG. 4.

As shown in operation 702, all masks for a single layer of a multi-patterned fabricated device are identified from a design. As described in detail above, this design may be used for eventual fabrication of the multi-patterned device. In one embodiment, all of these masks may be identified by default (i.e. without requiring user input selecting the masks, contrary to operation 502 in FIG. 5). Additionally, configuration parameters may be identified, such those described above in Table 1.

Then, in operation 704, a rule based search is executed to find closest separations between polygons of the masks. In an embodiment, the rule based search may identify polygons between the masks that have less than the Maximum Separation (i.e. CAs). This may be performed as described above in operation 504 of FIG. 5, except in the present method 700 all of the masks for the single layer of the multi-patterned fabricated device may be considered. It should be noted that this operation 704 may be well suited for use cases when overlay errors between two masks is not modulated on the wafer intentionally. Operation 704 may find out the CAs in step sizes by evaluating polygons of all masks in the design, thus targeting CAs susceptible to fail first due to random or systematic overlay errors.

In operation 706, the closest separations are flagged internally. In other words, polygons between the two masks that have less than the Maximum Separation may be flagged in memory. Optionally, operation 706 may include internally storing the centroid of the above described fragments.

Next, as shown in operation 708, additional rules are applied to filter the flagged polygons. These additional rules may relate to other features of the design, and specifically other features of the selected masks, such as other geometric features that are further indicative of areas of a design that are prone to overlay errors.

Further, in operation 710, any of the resulting filtered polygons that overlap are merged. For example, two immediate qualifying centroids can be merged together if they overlap in any direction and belong to the same directional group (X, Y or XY). As option, after the merge the resulting polygons may be ranked to indicate a level of likelihood of being associated with a design area that is prone to overlay errors.

The final result from operation 710 (or the ranked results) are exported in a format suitable for inspection, as shown in operation 712. This format may be a particular file format that is readable by an inspection system. The final results are then imported to the inspection system, as shown in operation 714, which may use the results (e.g. without regard to an overlay modulation map) to generate (e.g. large area) defect maps for various purposes (e.g. discovery, monitoring, etc.). In various exemplary embodiments, output of the inspection system may be provided as input to a metrology control plan or target design and/or used to monitor the weakest structures of a multi-patterned device fabricated from the design (i.e. those most susceptible to fail due to overlay errors).

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
receiving, by at least one computer system, a design of a multi-patterned fabricated device;
automatically determining from the design, by the at least one computer system, one or more areas of the design that are prone to causing overlay errors, wherein the automatic determination of the one or more areas of the design that are prone to causing overlay errors is further based on one or more predefined rules;
outputting, by the at least one computer system, an indication of the determined one or more areas to an inspection system for use in inspecting a multi-patterned device fabricated in accordance with the design;
receiving, by the inspection system from the at least one computer system, the indication of the determined one or more areas;
in response to receipt of the indication of the determined one or more areas, inspecting, by the inspection system, the determined one or more areas of the multi-patterned device for defects by:

a light source of the inspection system directing light towards the one or more areas of the multi-patterned device, a detector of the inspection system receiving light reflected from the one or more areas of the multi-patterned device and generating output responsive to the received light, and providing the output to the at least one computer system;

receiving, by the at least one computer system, the output; and processing, by the at least one computer system, the output to detect defects in the multi-patterned device.

2. The method of claim 1, wherein the multi-patterned device is a wafer.

3. The method of claim 1, wherein the design of the multi-patterned fabricated device includes a plurality of masks for a single layer of the multi-patterned fabricated device.

4. The method of claim 3, further comprising receiving, by the computer system, input from a user specifying two of the masks, wherein the automatic determination of the one or more areas of the design that are prone to causing overlay errors includes evaluating the two masks to determine the one or more areas of the design that are prone to causing overlay errors.

5. The method of claim 4, wherein evaluating the two masks includes determining whether a threshold separation exists between the two masks.

6. The method of claim 5, wherein each the one or more areas of the design are automatically determined to be prone to causing overlay errors as a result of having less than the threshold separation.

7. The method of claim 3, wherein the automatic determination of the one or more areas of the design that are prone to causing overlay errors includes, by default, evaluating all of the masks to determine the one or more areas of the design that are prone to causing overlay errors.

8. The method of claim 7, wherein evaluating all of the masks includes determining whether a threshold separation exists between adjacent masks.

9. The method of claim 8, wherein each the one or more areas of the design are automatically determined to be prone to causing overlay errors as a result of having less than the threshold separation.

10. The method of claim 1, wherein the one or more predefined rules each define a parameter value indicative of causing overlay errors.

11. The method of claim 10, wherein the parameter value includes a threshold distance between two masks for a single layer of the multi-patterned fabricated device.

12. The method of claim 10, wherein the parameter value includes a threshold pattern density for a mask of a single layer of the multi-patterned fabricated device.

13. The method of claim 1, further comprising ranking each of the one or more areas of the design that are prone to causing overlay errors.

14. The method of claim 13, wherein ranking each of the one or more areas of the design that are prone to causing overlay errors includes:

determining a parameter value of the area which caused the area to be determined as prone to causing an overlay error;

identifying a plurality of incremental ranges based on a preconfigured step size, wherein each of the incremental ranges is associated with a different rank indicative of a different level of likelihood of causing overlay errors;

determining one of the incremental ranges that includes the parameter value of the area; and assigning the area with the rank associated with the one of the incremental ranges determined for the area.

15. The method of claim 14, further comprising outputting a result of the ranking to the inspection system for use in prioritizing inspection of the one or more areas on the multi-patterned device fabricated in accordance with the design.

16. A non-transitory computer readable medium storing computer code executable by a processor to perform a method comprising:

receiving, by at least one computer system, a design of a multi-patterned fabricated device;

automatically determining from the design, by the at least one computer system, one or more areas of the design that are prone to causing overlay errors, wherein the automatic determination of the one or more areas of the design that are prone to causing overlay errors is further based on one or more predefined rules;

outputting, by the at least one computer system, an indication of the determined one or more areas to an inspection system for use in inspecting a multi-patterned device fabricated in accordance with the design;

causing, by the at least one computer system, the inspection system to:

receive, from the at least one computer system, the indication of the determined one or more areas;

in response to receipt of the indication of the determined one or more areas, inspect the determined one or more areas of the multi-patterned device for defects by:

a light source of the inspection system directing light towards the one or more areas of the multi-patterned device, a detector of the inspection system receiving light reflected from the one or more areas of the multi-patterned device and generating output responsive to the received light, and providing the output to the at least one computer system;

receiving, by the at least one computer system, the output; and processing, by the at least one computer system, the output to detect defects in the multi-patterned device.

17. A system, comprising:

at least one computer sub-system having a memory, and a processor for:

receiving a design of a multi-patterned fabricated device;

automatically determining from the design one or more areas of the design that are prone to causing overlay errors, wherein the automatic determination of the one or more areas of the design that are prone to causing overlay errors is further based on one or more predefined rules;

outputting an indication of the determined one or more areas to an inspection sub-system for use in inspecting a multi-patterned device fabricated in accordance with the design; and the inspection sub-system having a light source and a detector, the inspection sub-system for:

receiving, from the at least one computer sub-system, the indication of the determined one or more areas;

in response to receipt of the indication of the determined one or more areas, inspecting the determined one or more areas of the multi-patterned device for defects by:
    the light source of the inspection sub-system directing light towards the one or more areas of the multi-patterned device,
    the detector of the inspection sub-system receiving light reflected from the one or more areas of the multi-patterned device and generating output responsive to the received light, and
    providing the output to the at least one computer sub-system;
the at least one computer sub-system further for:
    receiving the output; and
    processing the output to detect defects in the multi-patterned device.

18. The system of claim 17, wherein the memory stores a script executable by the processor for performing the receiving, automatically determining, and the outputting.

19. The system of claim 17, wherein the inspection sub-system and the computer sub-system are in communication via transmission medium.

* * * * *

UNITED STATES PATENT AND TRADEMARK OFFICE
CERTIFICATE OF CORRECTION

PATENT NO. : 10,068,323 B2
APPLICATION NO. : 15/290990
DATED : September 4, 2018
INVENTOR(S) : Kaushik Sah et al.

Page 1 of 1

It is certified that error appears in the above-identified patent and that said Letters Patent is hereby corrected as shown below:

On the Title Page

Item (54) and in the Specification, Column 1, Lines 1 through 5, correct title is:
-- DESIGN AWARE SYSTEM, METHOD AND COMPUTER PROGRAM PRODUCT FOR DETECTING OVERLAY-RELATED DEFECTS IN MULTI-PATTERNED FABRICATED DEVICES --.

Signed and Sealed this
Sixth Day of November, 2018

Andrei Iancu
*Director of the United States Patent and Trademark Office*